(12) United States Patent
Rosenthal et al.

(10) Patent No.: US 11,790,261 B2
(45) Date of Patent: Oct. 17, 2023

(54) TUNABLE COUPLING BETWEEN A READOUT CAVITY AND A PARAMETRIC AMPLIFIER TO ENHANCE QUBIT MEASUREMENTS

(71) Applicants: The Regents of the University of Colorado, a body corporate, Denver, CO (US); Universitat Innsbruck, Innsbruck (AT)

(72) Inventors: Eric Rosenthal, Boulder, CO (US); Konrad Lehnert, Boulder, CO (US); Christian Schneider, Innsbruck (AT)

(73) Assignees: The Regents of the University of Colorado, a body corporate, Denver, CO (US); Universitat Innsbruck, Innsbruck (AT)

( * ) Notice: Subject to any disclaimer, the term of this patent is extended or adjusted under 35 U.S.C. 154(b) by 300 days.

(21) Appl. No.: 17/192,479

(22) Filed: Mar. 4, 2021

(65) Prior Publication Data

US 2022/0164694 A1    May 26, 2022

Related U.S. Application Data

(60) Provisional application No. 63/062,530, filed on Aug. 7, 2020, provisional application No. 62/985,266, filed on Mar. 4, 2020.

(51) Int. Cl.
*G06N 10/40* (2022.01)
*H03F 19/00* (2006.01)

(52) U.S. Cl.
CPC .............. *G06N 10/40* (2022.01); *H03F 19/00* (2013.01)

(58) Field of Classification Search
CPC ......... G06N 10/40; G06N 10/70; H03F 19/00
See application file for complete search history.

(56) References Cited

U.S. PATENT DOCUMENTS

| | | | |
|---|---|---|---|
| 2001/0025012 A1* | 9/2001 | Tarutani | H03F 19/00 505/100 |
| 2015/0241481 A1* | 8/2015 | Narla | H03F 19/00 324/602 |
| 2018/0260732 A1* | 9/2018 | Bloom | G06N 10/00 |

OTHER PUBLICATIONS

Siddiqi et al., The Josephson Bifurcation Amplifier for Quantum Measurements, Department of Applied Physics and Physics, Yale University, Jul. 11, 2005, pp. 1-10 (Year: 2005).*
Abdo, Baleegh et al., "Active Protection of a Superconducting Qubit With an Interferometric Josephson Isolator," Nature Communications, vol. 10, pp. 1-10, Jul. 17, 2019.

(Continued)

*Primary Examiner* — Nghia M Doan

(57) ABSTRACT

Technology is disclosed herein that the enhances the measurability and scalability of qubits in a quantum computing environment. In an implementation, a superconducting amplifier device comprises a parametric amplifier and a tunable coupling between the parametric amplifier and a readout cavity external to the superconducting amplifier device. The tunable coupling allows an entangled signal, associated with a qubit in the readout cavity, to transfer from the readout cavity to the parametric amplifier. The parametric amplifier amplifies the entangled signal to produce an amplified signal as output to a measurement sub-system.

20 Claims, 8 Drawing Sheets

(56) References Cited

OTHER PUBLICATIONS

Abdo, Baleegh et al., "Josephson Directional Amplifier for Quantum Measurement of Superconducting Circuits," Physical Review Letters, vol. PRL 112, pp. 167701-1-167701-5, Apr. 22, 2014.
Chapman, Benjamin J. et al., "Widely Tunable On-Chip Microwave Circulator for Superconducting Quantum Circuits," Physical Review X, vol. 7, pp. 041043-1-041043-16, Nov. 22, 2017.
Eddins, A. et al., "High-Efficiency Measurement of an Artificial Atom Embedded in a Parametric Ampifier," Physical Review X, vol. 9, pp. 011004-1-011004-11, Jan. 7, 2019.
Lecocq, F. et al., "Efficient Qubit Measurement With a Nonreciprocal Microwave Amplifier," Physical Review Letters, vol. 126, pp. 020502-1-020502-5, Jan. 13, 2021.
Opremcak, A. et al., "High-Fidelity Measurement of a Superconducting Qubit Using an On-Chip Microwave Photon Counter," Physical Review X, vol. 11, pp. 011027-1-011027-15, Feb. 10, 2021.
Opremcak, A. et al., "Measurement of a Superconducting Qubit With a Microwave Photon Counter," Science, vol. 361, Issue 6408, pp. 1239-1242, Sep. 21, 2018.
Sliwa, K. M. et al., "Reconfigurable Josephson Circulator/Directional Amplifier," Physical Review X, vol. 5, pp. 041020-1-041020-10, Nov. 5, 2015.
Thorbeck, T. et al., "Reverse Isolation and Backaction of the SLUG Microwave Amplifier," Physical Review Applied, vol. 8, 5 pages, Nov. 6, 2017.

\* cited by examiner

TUNABLE COUPLING BETWEEN A READOUT CAVITY AND A PARAMETRIC AMPLIFIER TO ENHANCE QUBIT MEASUREMENTS

RELATED APPLICATIONS

This application is related to, and claims the benefit of priority to, U.S. Provisional Patent Application No. 62/985,266, filed on Mar. 4, 2020, and entitled SCALABLE SUPERCONDUCTING QUBIT MEASUREMENT WITH MINIMAL BACKACTION, as well as U.S. Provisional Patent Application No. 63/062,530, filed on Aug. 7, 2020, and also entitled SCALABLE SUPERCONDUCTING QUBIT MEASUREMENT WITH MINIMAL BACKACTION, both of which are hereby incorporated by reference in their entirety.

STATEMENT REGARDING FEDERALLY FUNDED RESEARCH

This invention was made with government support under grant number PHY1125844 awarded by the National Science Foundation; grant number W911NF-14-1-0079 awarded by the U.S. Army Research Office; grant number FA9550-15-1-0015 award by the AFOSR MURI; and grant number 1734006 awarded by the National Science Foundation. The government has certain rights in the invention.

TECHNICAL FIELD

Aspects of the disclosure are related to the field of quantum computing devices and in particular, to an amplification device that improves the measurement of qubits.

BACKGROUND

Superconducting qubits are a leading platform for scalable quantum computing and quantum error correction. One feature of this platform is the ability to perform projective measurements orders of magnitude more quickly than qubit decoherence times. Such measurements are enabled by the use of quantum-limited parametric amplifiers in conjunction with ferrite circulators—magnetic devices which provide isolation from noise and decoherence due to amplifier backaction. Unfortunately, these nonreciprocal elements have limited performance and are not easily integrated on chip.

Overview

Technology is disclosed herein that the enhances the measurability and scalability of qubits in a quantum computing environment. In an implementation, a superconducting amplifier device comprises a parametric amplifier and a tunable coupling between the parametric amplifier and a readout cavity external to the superconducting amplifier device. The tunable coupling allows an entangled signal, associated with a qubit in the readout cavity, to transfer from the readout cavity to the parametric amplifier. The parametric amplifier amplifies the entangled signal to produce an amplified signal (entangled or not) as output to a measurement sub-system.

This Overview is provided to introduce a selection of concepts in a simplified form that are further described below in the Technical Disclosure. It may be understood that this Overview is not intended to identify key features or essential features of the claimed subject matter, nor is it intended to be used to limit the scope of the claimed subject matter.

BRIEF DESCRIPTION OF THE DRAWINGS

Many aspects of the disclosure may be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views. While several embodiments are described in connection with these drawings, the disclosure is not limited to the embodiments disclosed herein. On the contrary, the intent is to cover all alternatives, modifications, and equivalents.

DETAILED DESCRIPTION

Figure 1:
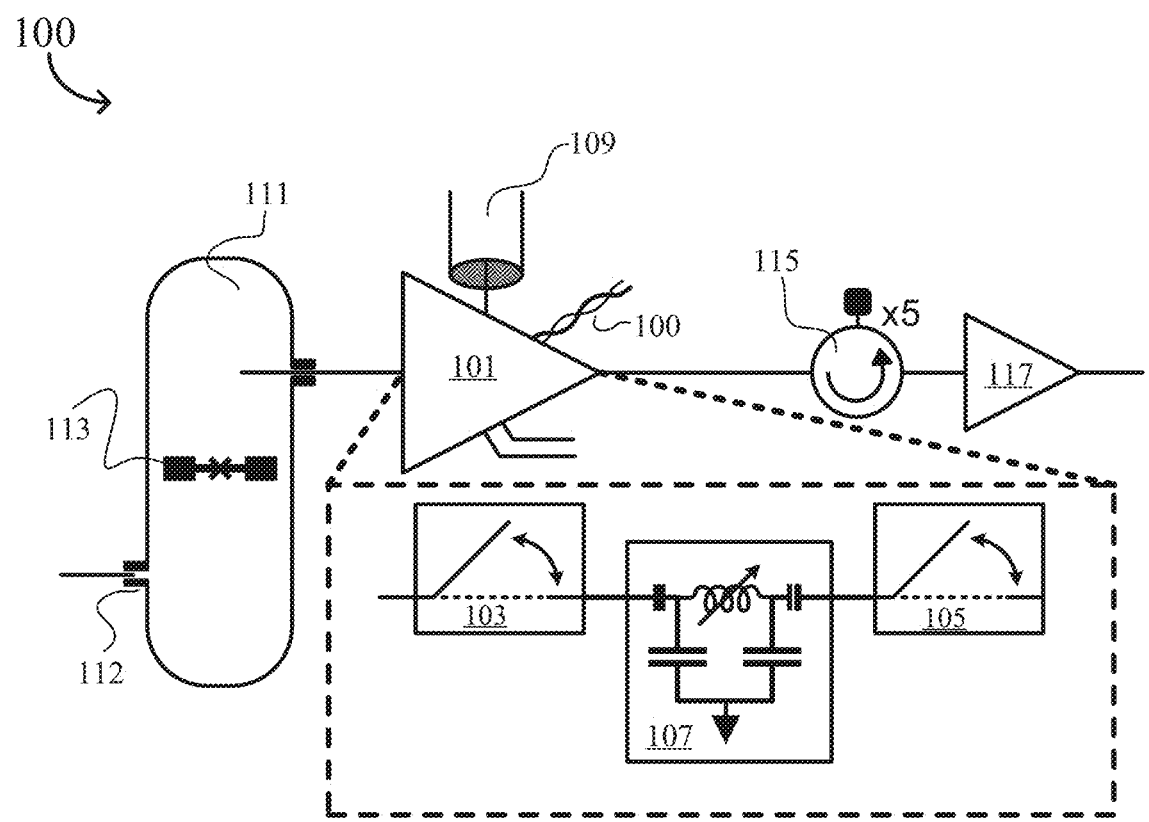
FIG. 1 illustrates a quantum computing environment in an implementation.

Various solutions to the challenges discussed above are disclosed herein, including an approach wherein an entangled signal produced in a readout cavity is swapped into a superconducting amplifier device using a tunable coupling. The tunable coupling between the readout cavity and the amplifier device may be provided by—for example—a superconducting switch, superconducting junction-based couplers, variable microwave-frequency couplers, or any other suitable coupling. The tunable coupling allows an entangled signal, associated with a qubit in the readout cavity, to transfer from the readout cavity to a parametric amplifier in the amplifier device.

The parametric amplifier amplifies the entangled signal to produce an amplified signal which may then be output to a measurement sub-system. Entanglement may be preserved in some scenarios but lost in others during amplification as preserving entanglement is not required for the disclosed readout to succeed. A second tunable coupling may be provided between the parametric amplifier and measurement sub-system to allow the amplified signal to reach the measurement sub-system, although such a coupling need not be tunable.

A superconducting switch or other suitable tunable coupling mechanism provide for control over the coupling between a qubit and amplifier. Doing so allows a transmon qubit to be measured using a single, chip-scale device to provide both parametric amplification and isolation from the bulk of amplifier backaction. This measurement is also fast, high fidelity, and more efficient compared to existing superconducting qubit measurements. As such, these solutions provide a high-quality platform for the scalable measurement of superconducting qubits.

Qubit-specific projective measurement is a requirement for scalable quantum computation and quantum error correction. In superconducting systems, qubit measurement generally involves scattering a microwave pulse off of a readout cavity dispersively coupled to the qubit. This pulse is routed through ferrite circulators and/or isolators to a Josephson-junction-based parametric amplifier, sent to room temperature, and digitized. This readout scheme can work well: it is low backaction, quantum nondemolition, and can have infidelity of 10^(−2) in less than 100 ns, with the best reported infidelity of less than 10^(−4). Challenges arise, however, as the scale and requirements of superconducting quantum systems increase.

In particular, ferrite circulators are bulky and their requisite number scales linearly with the number of measurement channels. Fitting enough circulators at the base temperature stage of a cryostat is one eventual bottleneck associated with building a scalable quantum computer. Furthermore, circulators are both lossy and provide finite isolation from amplifier noise. Isolation can be improved using multiple isolators in series, but at the cost of increased resistive loss and impedance mismatches, which necessitate a stronger readout pulse in order to make a projective qubit measurement. This can be just as detrimental as amplifier backaction; both have the potential to drive higher-level state transitions which can cause readout errors and reduce the extent to which a measurement is quantum nondemolition.

In recognition of these problems, it has been a longstanding goal to replace ferrite circulators and isolators with a chip-scale, higher-performance alternative. Efforts to do so have often involved parametrically coupling high-Q resonant modes or concatenating frequency conversion and delay operations. Such technologies show promise but have yet to supplant ferrites. Performance specifications such as isolation and bandwidth must still be improved, and multiple high frequency control tones per device are undesirable from the perspective of scalability. An alternate approach is to simply remove any nonreciprocal components between the qubit and first, Josephson-junction-based amplifier. This allows for high efficiency but at the cost of significant exposure to amplifier backaction.

Instead, a replacement for ferrites is proposed herein that is based on the coordinated operation of superconducting switches. These switches are integrated into a single, chip-scale device referred to herein as a 'superconducting isolating modular bifurcation amplifier' (SIMBA), illustrated in FIG. 1. In FIG. 1, a quantum computing environment 100 includes a SIMBA, represented by amplifier device 101, which itself includes a two-port parametric cavity (a Josephson parametric amplifier, represented by parametric cavity 107. Amplifier device 101 also includes two fast, low-loss and high on-off ratio superconducting switches placed on both ports of amplifier device 101, represented by switch 103 and switch 105 respectively. These switches are dc actuated, requiring no microwave control tones. Pulsed, unidirectional gain is realized by the sequential operation of these switches combined with resonant delay, and parametric gain, in the parametric cavity 107. These novel operations demonstrate the efficient, high-quality readout of a superconducting qubit while simultaneously isolating it from the bulk of amplifier backaction.

Central to amplifier device 101 is parametric cavity 107, which is a flux-pumped parametric cavity comprising a lumped-element inductor-capacitor circuit where approximately half the inductance comes from an array of superconducting quantum interference devices (SQUIDs). The parametric cavity resonant frequency can be tuned between 4 and 7.1 GHz by applying an external magnetic flux. When flux through these SQUIDs is modulated at twice the cavity resonance frequency, the cavity state undergoes phase-sensitive parametric amplification via three-wave mixing. The external coupling of parametric cavity 107 is controlled by superconducting switches (switch 103 and switch 105) constructed using a 'tunable inductor bridge' (TIB). TIB transmission is tuned by a dc signal which changes the balance of a Wheatstone bridge of SQUID arrays.

In an exemplary scenario, the speed at which transmission can be tuned is limited by off-chip, low-pass filters with a 350-MHz cutoff frequency placed on the TIB bias lines. Tested in isolation, the TIB has an on/off ratio greater than 50 dB tunable between 4 and 7.3 GHz. This overlaps with the range over which parametric cavity 107 can be tuned, allowing the amplifier device 101 itself to be tuned to operate over several GHz. The TIB 1-dB compression point is approximately −98 dBm, which crucially allows the TIB to function effectively while the state in the parametric cavity is amplified.

Figure 2:
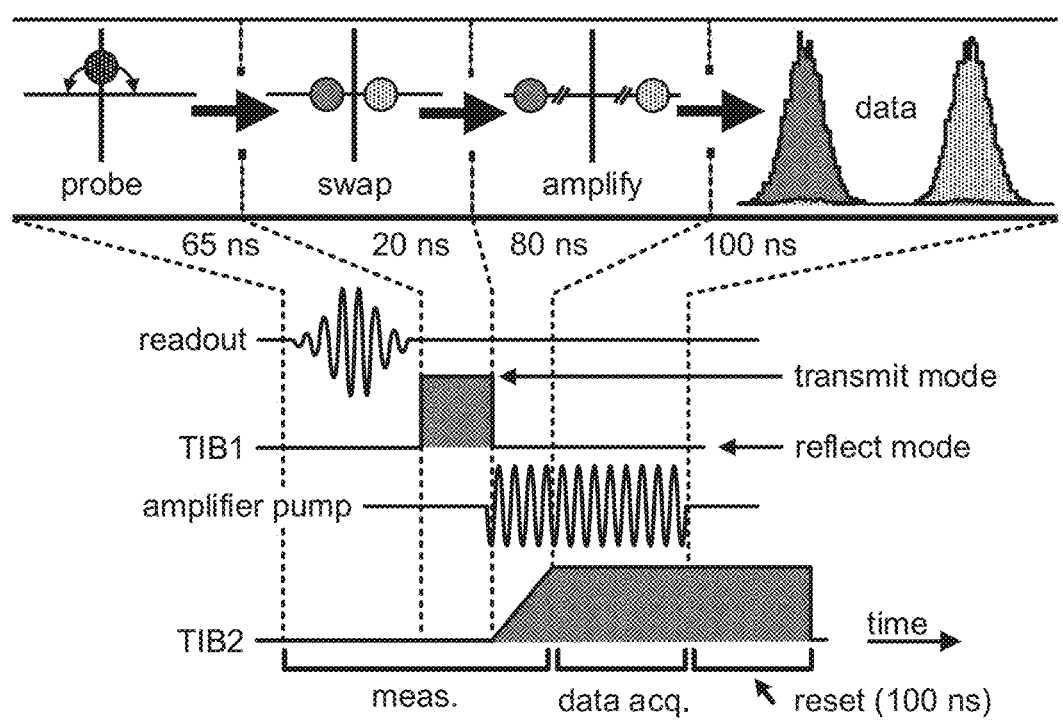
FIG. 2 illustrates an operational scenario in an implementation.

FIG. 2 illustrates the operations 200 of a superconducting amplifier device as contemplated herein (e.g., amplifier device 101). Such a device may be used to measure a transmon qubit dispersively coupled to a readout cavity. In operation, a pulse is first sent into the weakly coupled port 112 of a two-port readout cavity, where it acquires a qubit-state-dependent phase shift. Switch 103 (TIB1) is then set to transmit mode for a duration (20 ns), chosen to fully swap this pulse into the parametric cavity 107, which has previously been tuned near resonance. The parametric cavity 107 is then strongly flux pumped into the bistable regime: a nonunitary process in which the cavity latches into one of two bistable states with opposite phase but large, equal amplitudes.

Readout is achieved by seeding the parametric cavity state with the probe tone, such that the postmeasurement qubit state is correlated with the latched state of the parametric cavity 107. This design discretizes and stores the measurement result within the cryostat as a step toward implementing rapid and hardware efficient feed-forward protocols. To learn the measurement result outside of the cryostat, switch 105 (TIB2) is set to transmit mode, coupling this state to a standard cryogenic microwave measurement chain or other such measurement sub-system. Three figures of merit describe the success of this readout: excess backaction nb, measurement efficiency η, and maximum readout fidelity F0. A framework of measurement-induced dephasing characterizes these quantities. Ideally, measurement-induced dephasing of the qubit comes only from a readout pulse. Consider a qubit prepared in a superposition state $(|0\rangle + |1\rangle)/\sqrt{2}$; a readout pulse at the appropriate frequency interacts with this qubit to create the entangled state $(|0\rangle|\alpha_0\rangle + |1\rangle|\alpha_1\rangle)/\sqrt{2}$. Here $|\alpha_0\rangle$ and $|\alpha_1\rangle$ are coherent states both of amplitude $|\alpha|$, separated in phase space by the angle $2\theta = 2 \arctan(2\chi/\kappa_r)$, where the readout cavity frequency shifts by $\pm\chi/2\pi$ dependent on the qubit state, and $\kappa_r/2\pi$ is the loss rate of the readout cavity.

After measurement, the off-diagonal element of the qubit density matrix becomes $$|\rho'_{01}| = \frac{1}{2}\langle \alpha_0 | \alpha_1 \rangle = \frac{1}{2}e^{-2n_r},$$

where $n_r = (|\alpha| \sin \theta)^2$ is the effective photon number of the readout pulse, corresponding to the square of half the separation in phase space between $|\alpha_0\rangle$ and $|\alpha_1\rangle$. Here, $n_r$ is nearly equal to the readout pulse photon number $|\alpha|^2$ Because $2\chi/2\pi = 1.93$ MHz and $\kappa_r/2\pi = 440$ kHz, so that $n_r = 0.95|\alpha|^2$. In practice, measurement may include "excess backaction" or additional dephasing. This is modeled as an additional pulse with an effective photon number, $$n_b = -\frac{1}{2}\log(2\rho_b) \quad (1)$$

such that the coherence of a superposition state is reduced to $|\rho'_{01}| = \frac{1}{2}e^{-2(n_b+n_r)} = \rho_b e^{-2n_r}$, where $0 \leq \rho_b \leq \frac{1}{2}$ is the postmeasurement coherence in the absence of readout photons. The effective photon number $n_r$ in a given readout pulse is not a priori known but is related to its amplitude expressed in experimental units, $\epsilon \propto \sqrt{n_r}$. The measurement-induced dephasing can therefore be expressed as $$|\hat{\rho}'_{01}| = \rho_b e^{-2(\sqrt{n_r})^2} = \rho_b e^{-\epsilon^2/2\sigma^2} \quad (2)$$

where $\sqrt{n_r} = \epsilon/2\sigma$ and, physically, the constant $\sigma$ calibrates the readout pulse amplitude in units of (photon number)$^{\frac{1}{2}}$.

A dephased qubit indicates that information about its energy eigenstate may be learned by a detector. This information may be quantified by a readout fidelity, $$F_r = 1 - P(e|\pi) - P(g|\pi) \quad (3)$$

where $P(e|0)$ and $P(g|\pi)$ are the probability of incorrect assignment when the qubit is prepared in the ground or excited state, respectively. For dispersive readout using a thresholded measurement, readout fidelity is $F_r$:

$$F_r = F_0 \, \text{erf}[\sqrt{2\eta n_r}] = F_0 \, \text{erf}[v\epsilon] \quad (4)$$

Here $F_0$ is the maximum readout fidelity, and $\eta = \eta_{loss}\eta_{amp}$ is the measurement efficiency, defined here such that $1-\eta_{loss}$ is the fraction of readout pulse energy which has been lost before the pulse undergoes parametric amplification, which is assumed to be noiseless such that $\eta_{amp} = 1$. The constant $v = \sqrt{2\eta n_r}/\epsilon$ characterizes how quickly $F_r$ increases with readout power. The relationship between $v$ and $a$ gives the convenient formula, $$\eta = 2\sigma^2 v^2 \quad (5)$$

Figure 3:
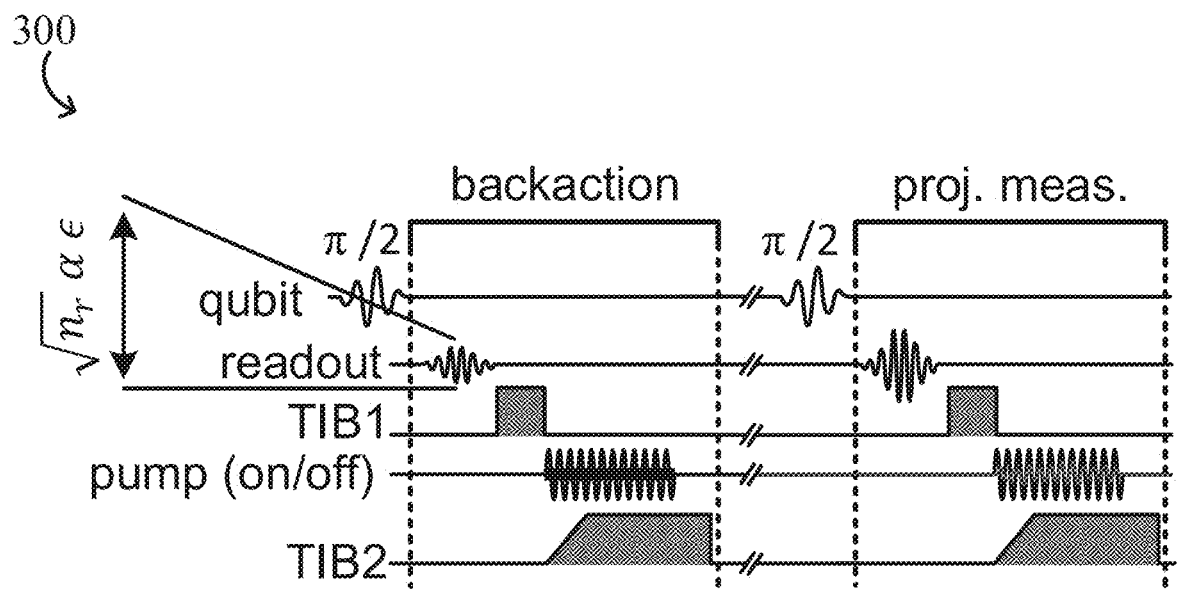
FIGS. 3-5 illustrate exemplary characterizations of the operation a superconducting amplifier device in an implementation.
Figure 4:
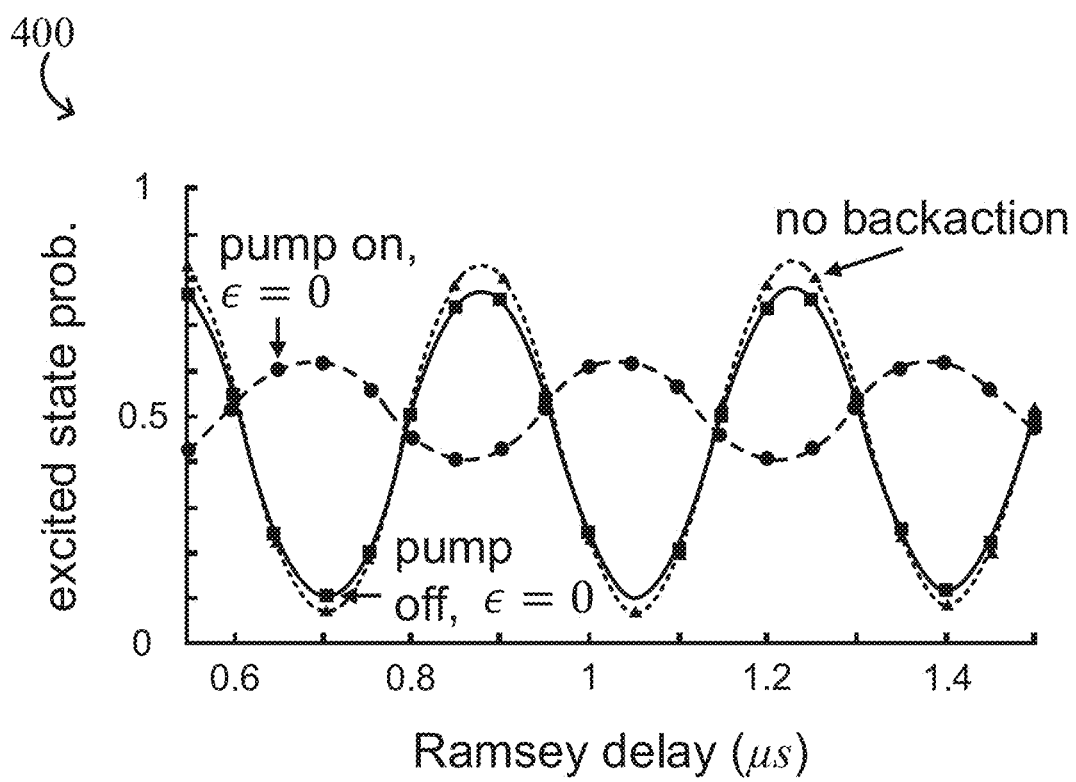
Figure 5:
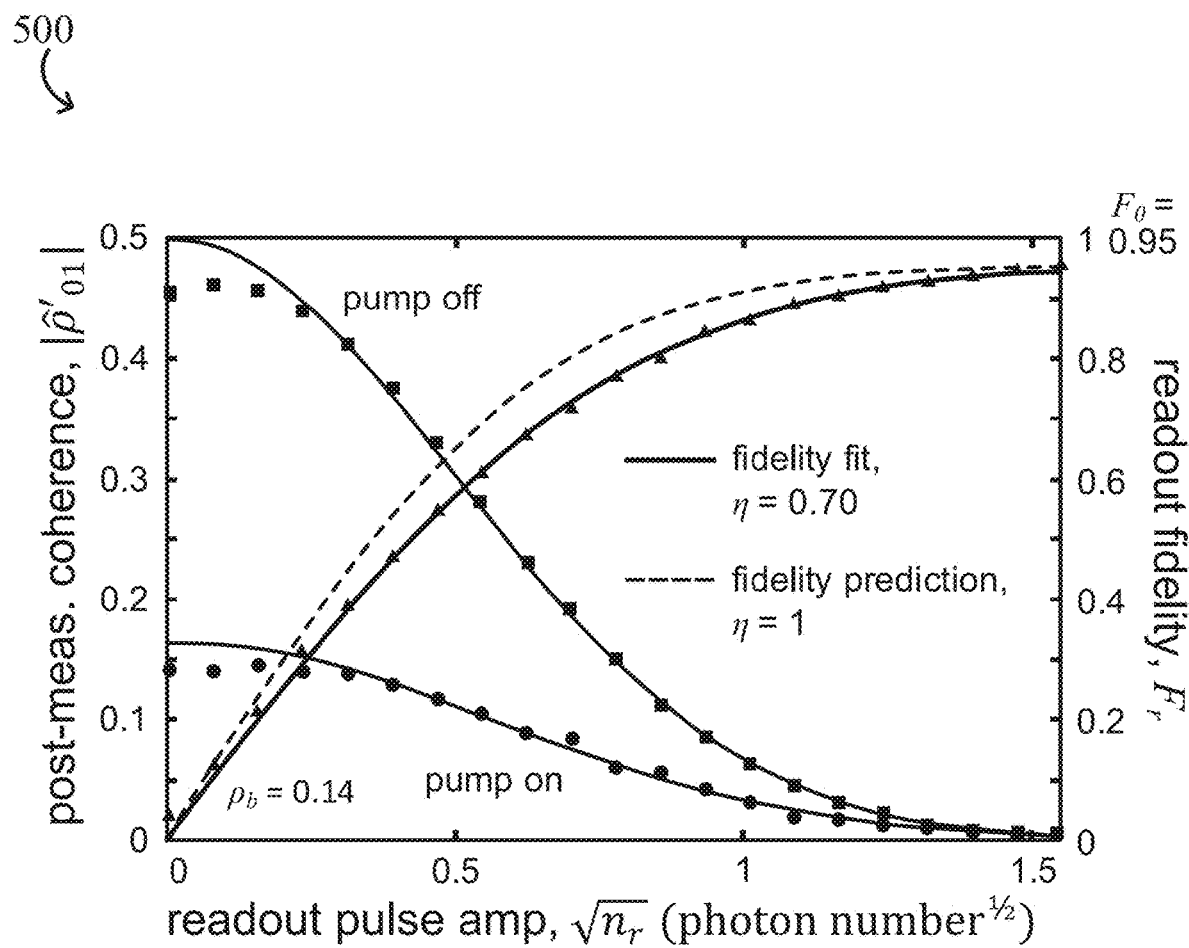

Intuitively, measurement efficiency $\eta$ is determined by the readout fidelity of a weak measurement (quantified by $v$), compared to its backaction (quantified by $a$). To experimentally determine the figures of merit nb, $\eta$, and $F_0$, readout fidelity and postmeasurement coherence were measured, both as functions of the experimental readout amplitude. FIGS. 3-5 illustrate various characterizations of the experimental operations. In FIG. 3, characterization 300 illustrates one or more operations whereby post-measurement qubit coherence $|\rho'_{01}|$ is obtained by inserting a variable measurement into a Ramsey sequence, exposing the qubit to backaction. The ratio of the amplitude of the measured Ramsey fringes to the amplitude of those measured without this backaction (nothing inserted into the Ramsey sequence) equals $2|\rho'_{01}|$. In FIG. 4, characterization 400 illustrates one or more operations whereby excess backaction is determined by inserting a "measurement" with zero readout amplitude. Post-measurement coherence after excess backaction with the parametric cavity pump on and off, are compared to a case with no backaction (no readout pulse, pump, or TIB switching inserted in the Ramsey sequence, violet). In FIG. 5, characterization 500 illustrates one or more operations whereby post-measurement coherence $|\rho'_{01}|$ (left y axis) and readout fidelity $F_r$ (right y axis, red data points) are measured while sweeping the readout amplitude $\sqrt{n_r}$ of a variable strength measurement. As in FIG. 2, $|\rho'_{01}|$ is measured both with the parametric pump turned on or off during the variable measurement sequence. Post-measurement coherence with the parametric pump turned on, but in the absence of readout photons, is specified by $\rho_b = |\rho'_{01}(\sqrt{n_r})|$ and determines the excess backaction $n_b = -\log(2\rho_b)/2$. Measurement efficiency $\eta$ is determined by a comparison between measurement-induced dephasing and readout fidelity while sweeping readout amplitude.

More specifically, readout fidelity $F_r$ is computed by measuring $P(e|0)$ and $P(g|\pi)$ and using Eq. 3. To measure $|\rho'_{01}|$, the qubit is prepared in a superposition state, exposed to backaction from a variable strength measurement with readout pulse amplitude $\epsilon \propto \sqrt{n_r}$, and then projectively measured after a variable Ramsey delay and a second $\pi/2$ pulse.

The backaction is first characterized from a "measurement" of zero readout amplitude, $=0$, meaning backaction solely due to actuating the TIBs (leftmost point in the "pump off" FIG. 5), and the combination of actuating the TIBs and pumping the parametric cavity (leftmost data point, "pump on" data). The sweep repeats over the variable amplitude, both with the parametric pump turned off and on during the variable measurement.

For comparison, qubit coherence is also measured without exposure to any backaction, meaning no variable measurement inserted into the Ramsey delay (e.g., FIG. 4). The ratio of the Ramsey fringe amplitudes with or without exposure to backaction gives $2|\rho'_{01}|$, with the ratio taken to correct for readout infidelity. This characterization determines that the readout is low backaction, high fidelity, and high efficiency.

Excess backaction is found from $\rho_b = 0.141 \pm 0.002$ (leftmost data point, pump on data, FIG. 5; uncertainty represents ±1 standard deviation). Using Eq. 1, this corresponds to $n_b = 0.63 \pm 0.01$ effective photons of excess backaction: about one-quarter of the $n_r^{proj} = 2.4$ effective photons used in a projective measurement (the maximum value on the x axis of FIG. 5), and far less than the ~150 photons in the pumped state of the parametric cavity. Next, $v$ and the maximum fidelity $F_0 = 95.5\% \pm 0.3\%$ are found by fitting $F_r$ versus readout amplitude (FIG. 5) to Eq. 4.

Finally, a is obtained from a fit of the pump off data to Eq. 2, and therefore determine $\eta = 70.4\% \pm 0.9\%$ using Eq. 5. This fit excludes the first four data points, which level off more quickly than predicted such that excess backaction includes $0.05 \pm 0.01$ effective photons caused solely by actuating the TIBs. This dephasing process is not captured by the model and may result from a noise source on the parametric cavity side of TIB1. The limitations on $n_b$, $\eta$ and $F_0$ are understood and their values may be improved upon. Excess backaction primarily results from the −26 dB of transmission through TIB1 when in reflect mode. This transmission is higher than the −50 dB of transmission measured in a single TIB in isolation, a discrepancy which may result from the solvable problems of a spurious transmission path within the chip or sample box, or the pumped parametric cavity state approaching the power handling capability of the TIB. Maximum readout fidelity is limited by qubit decay and state preparation error including a~2% thermal population, errors which do not represent limitations of the SIMBA itself. Finally, efficiency is limited primarily by the 4.0 MHz±0.2 MHz loss rate of the parametric cavity. The dominant contributions to this loss are the nonzero transmission through TIB2 when in reflect mode, on-chip dissipation, and coupling to cable modes: effects which may all be mitigated.

It may therefore be appreciated that the transmon qubit is measured using a chip-scale, pulsed directional amplifier as disclosed herein. The qubit is isolated from amplifier backaction using a superconducting switch to control the coupling between a readout and parametric cavity. Simultaneously demonstrated metrics for this readout are given in Table I.

TABLE 1

Readout performance summary.

| Parameter | Value |
|---|---|
| Measurement efficiency | $\eta = 70.4\% \pm 0.9\%$ |
| Excess backaction | $n_b = 0.66 \pm 0.01$ photons |
| Maximum readout fidelity | $F_0 = 95.5\% \pm 0.3\%$ |
| Measurement time | 265 ns |

With reasonable changes to the SIMBA and experimental setup, it is possible to achieve $\eta > 90\%$ with $F_0 > 99\%$, $n_b \leq 0.02$ and a measurement time of less than 100 ns. This demonstration combines state-of-the-art measurement efficiency and considerable isolation from amplifier backaction such that $n_b \sim n_r^{proj}/4$. The measurement efficiency of previous superconducting qubit readout schemes has been limited to $\eta = 80\%$, and less when providing any isolation before a parametric amplifier. Near-unit measurement efficiency after future improvements would allow for near-complete access to the information extracted from a quantum system. Additionally, the SIMBA is chip scale, compatible with scalable fabrication procedures including the use of through-silicon vias and requires only one microwave control tone to operate. The SIMBA is therefore a favorable choice for high-quality and scalable superconducting qubit measurement.

Figure 6:
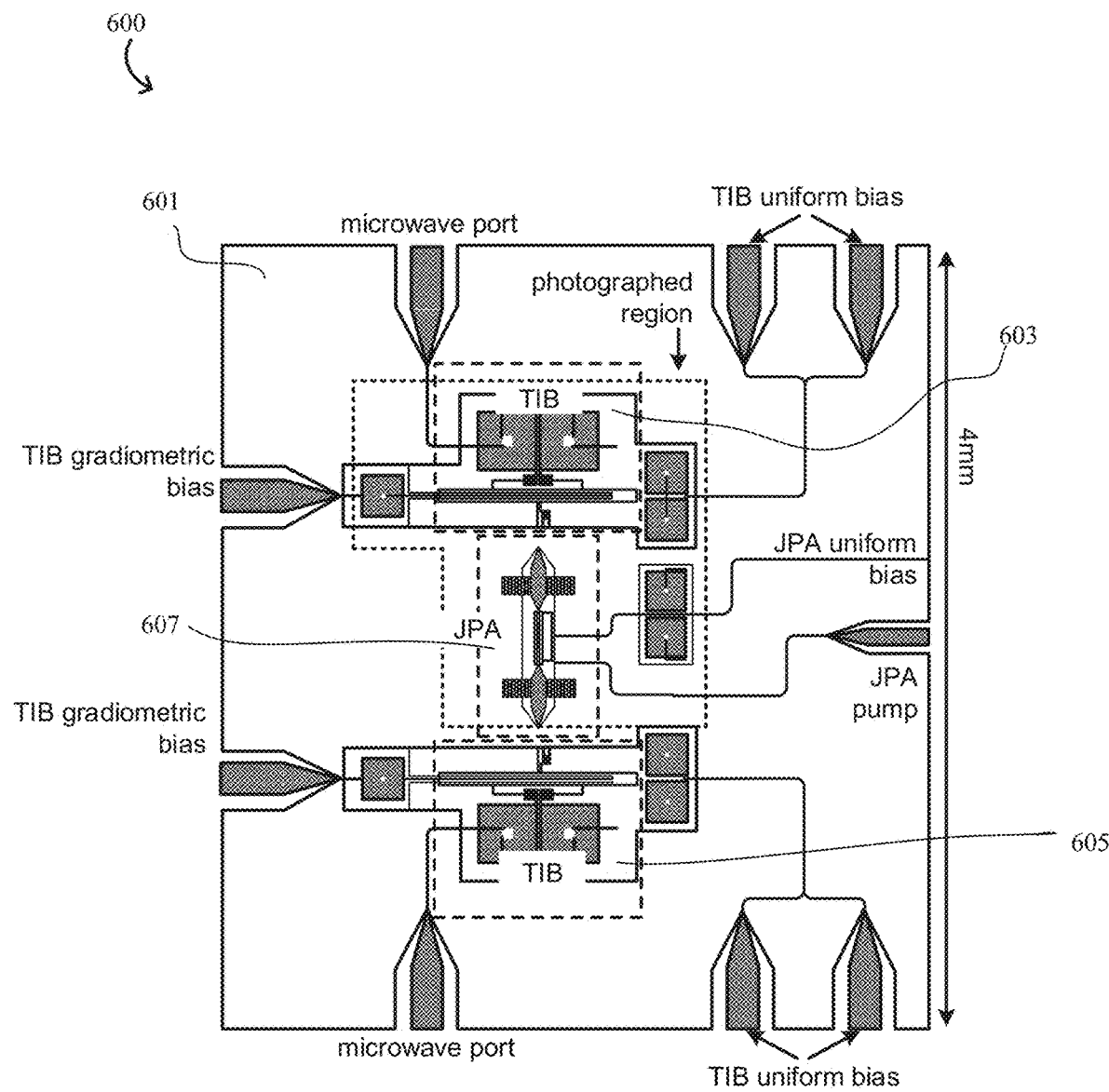
FIG. 6 illustrates a chip layout in an implementation.
Figure 7:
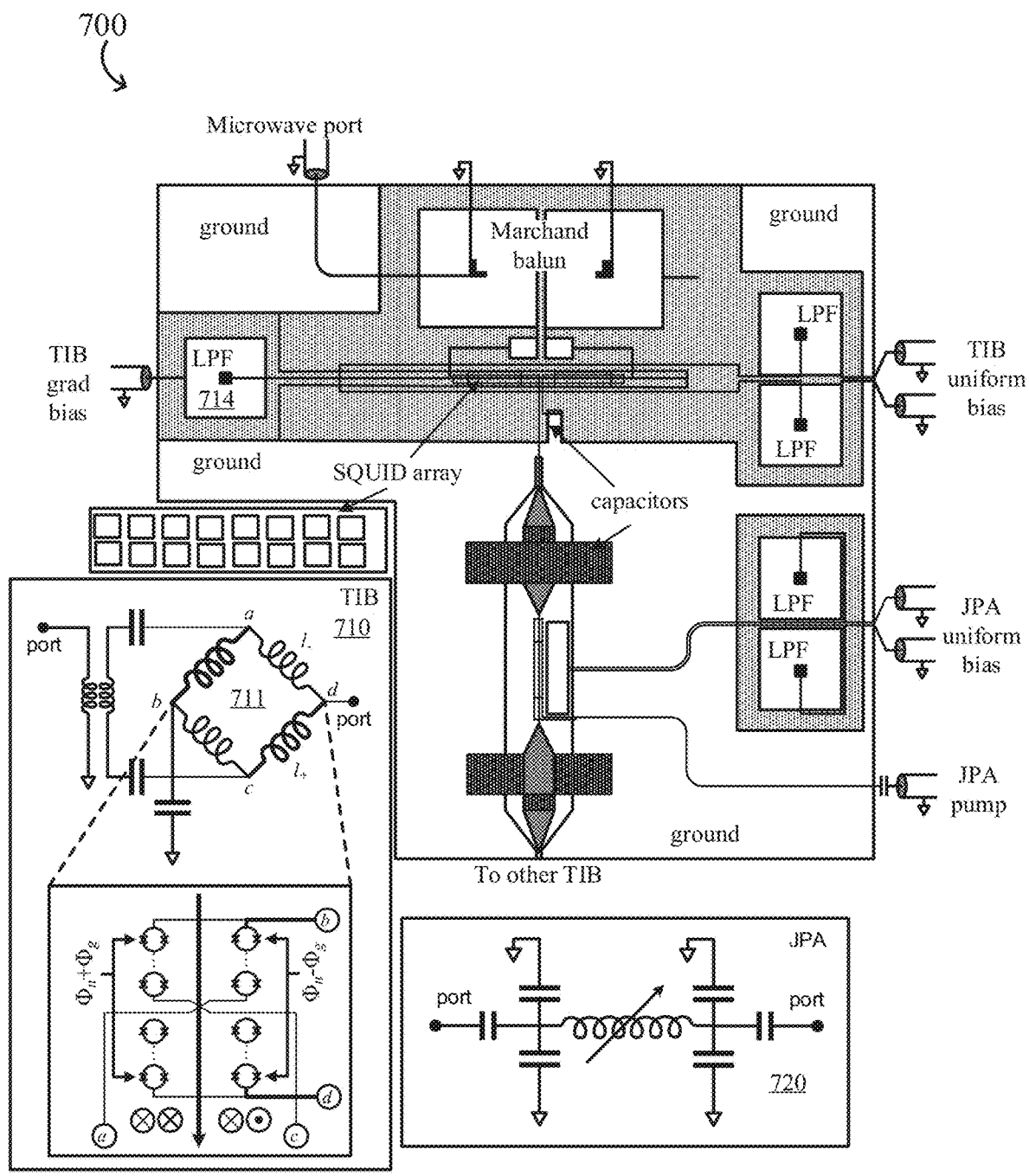
FIG. 7 illustrates an optical micrograph an implementation.

A layout 600 of a SIMBA chip 601 is shown in FIG. 6, and an optical micrograph 700 of the device is shown in FIG. 7. The SIMBA chip 601 includes two TIBs (603, 605) and a JPA 607. A micrograph of the region within the smaller dashed line is shown in FIG. 7. The SIMBA chip extends 2.5 mm to the right of the region illustrated here, such that the wire bonding pads for the 'JPA uniform bias' and 'JPA pump' lines are not shown.

Fabricated in a Nb/AlOx/Nb tri-layer process, the SIMBA fabrication procedure uses a low-loss amorphous silicon dielectric (loss tangent $(=1.5 \times 10^{-4} - 5 \times 10^{-4}$ at mK temperatures) in the metal-insulator-metal capacitors within the TIBs. The internal design of the TIB allows it to function as a simple microwave switch. In contrast with the prior art, the TIBs disclosed herein are significantly improved. In particular, past TIBs had a chipmode around 5 GHz (near to the qubit frequency in the SIMBA experiment discussed herein) and had greater loss out of their bias lines due to a lack of any on-chip, low-pass filters on these lines. Finally, these bias lines were constructed in an 'unshielded' way such that crosstalk between bias lines on a compact circuit like the SIMBA would likely have presented a problem. The novel TIBs disclosed herein have been engineered to eliminate these specific problems such improvements assist with achieving high-quality performance from the integrated SIMBA device.

Conceptually, the TIB can be thought of as a superconducting analog to a microwave mixer, with diodes replaced by SQUID arrays. As with a mixer, the TIB functions as a microwave switching/modulation element where symmetry of a Wheatstone bridge allows for high performance, broadband operation. In particular, the process of preserving vs. breaking the symmetry of the bridge allows for transmission through the TIB to be tuned by a far greater ratio than its constituent inductors can be tuned.

A lumped-element schematic 710 of a TIB is shown in FIG. 7. A balun couples the left port of the TIB to the differential voltage across the top and bottom nodes of the bridge (nodes a and c). No signal can couple between the two ports when the bridge is balanced, meaning that all four bridge inductors have equal value. To see this, consider an oscillating signal of amplitude v applied at the left port of the lumped element circuit in FIG. 7. Voltage at the top and bottom nodes of the bridge (nodes b and d) will oscillate with amplitude v0, respectively, creating an effective ground at the right port and therefore the TIB will reflect (the amplitude v0 will in general depend on the operating frequency, choice of capacitors, etc.). If instead the bridge is imbalanced, as drawn, the symmetry of the bridge is broken so that the right port does not see an effective ground, and thus transmission can be nonzero. Capacitors are added to match the circuit over a desired frequency range.

In the TIB circuit layout, the Wheatstone bridge 711 is twisted into a figure-eight geometry in order to tune the bridge imbalance with a single bias line while preserving as much symmetry in the circuit as possible. This bias line runs through the center of the figure-eight and puts a gradiometric flux g into the SQUID arrays on opposite sides of the bridge. At the same time, all the arrays see an identical uniform background flux u.

Gradiometric bias lines in FIG. 7 contain a low-pass filter (LPF 714), realized with a 20 nH spiral inductor. This filter limits microwave power coupling out of the bias line. A numerical finite-element simulation indicates that this inductor has a self-resonance frequency of 7.9 GHz (note that in this style of inductive filter, a higher inductance will generally lead to a lower self-resonance frequency). Further simulations indicate that bias port is generally smaller than −40 dB between 4 and 8 GHz with inclusion of this LPF, but as high as −20 dB without it. At the operational frequency of 6.34 GHz, transmission from a microwave port of a TIB out of its gradiometric bias port is simulated to be between −39 dB and −47 dB (the exact value changes slightly depending on which of the two microwave ports is used, and whether the TIB is in transmit or reflect mode). The TIBs used in this work contain a second on-chip bias line for applying a dc uniform flux u. This bias line also contains two LPFs.

FIG. 7 also includes a lumped element schematic 720 of the JPA is shown in FIG. 7. A resonator is formed by an inductor (realized with a SQUID array similar to that in the TIBs), with 430 fF capacitors to ground on either side. When the SQUID array inductance is biased to be minimum, the array has an inductance of 0.66 nH. The geometric inductance of the resonator is 0.52 nH. To turn on parametric gain, flux through these SQUIDs is modulated at twice the JPA resonance frequency using a microwave bias line, which contains an on-chip capacitor to block dc-current. Current through a second flux bias line (containing low pass filters) can be used to change the uniform dc-flux through the SQUID array, tuning the JPA frequency. A fingered capacitor (80 fF) is placed between the JPA and each TIB, which may limit the coupling rate.

The JPA is configured and/or characterized by setting TIB2 to transmit mode and measuring in reflection off of TIB2. Doing so, the JPA frequency is tunable between approximately 4 and 7 GHz, a similar range over which the TIB is designed to operate. The SIMBA may therefore be tuned to operate over a several GHz frequency range.

The following describes a process employing a SIMBA to measure a superconducting qubit, beginning with calibration. The calibration procedure for superconducting qubit readout using a SIMBA is summarized below.

1. Tune the JPA frequency to the readout cavity frequency.
2. Sweep the JPA pump amplitude such that the JPA gives desired gain/bifurcation.
3. Choose the readout pulse amplitude and frequency, and the qubit pulse amplitude and frequency. Because the SIMBA is a phase-sensitive amplifier, the phase difference between the readout tone and the pump tone may be calibrated.
4. To optimize readout fidelity, sweep the duration for which TIB1 is set to transmit mode.
5. Fine-tune TIB reflect modes to minimize backaction, and to maximize the measurement efficiency.

The first three steps are generally true of any readout scheme which uses a tunable, narrow band and phase sensitive parametric amplifier. The final two steps are SIMBA-specific.

To maximize efficiency and minimize excess backaction, special care should be taken to determine the best reflect modes for TIB1 and TIB2. The reflect modes of both TIBs occur when current in their gradiometric bias lines is set near zero. This can be quickly checked by measuring transmission through the readout cavity while sweeping the gradiometric flux bias on either TIB1 or TIB2 with the other fixed. In practice, the optimal reflect mode may occur when this current is slightly offset from zero.

Measurement of excess backaction at this operating point is a measure of the isolation provided by TIB1. This isolation can alternatively be measured by the following procedure: the qubit is prepared in the excited state, and then projectively measured after a delay placed between the readout pulse and the rest of the measurement procedure. The resulting oscillations correspond to the readout pulse swapping back and forth between the readout and parametric cavities when TIB1 is in reflect mode. The average measured swap time is 380 ns.

The isolation provided by TIB1 can thus be expressed by comparing the ratio of the swap time when TIB1 is in reflect mode, when TIB1 is in transmit mode (20 ns): T=20 log 10(20/380)=−25.6 dB. For comparison, one commercial cryogenic ferrite circulator provides −18 dB of isolation.

The degree to which qubit readout using a SIMBA is quantum non-demolition (QND) may vary. QND-ness is defined as the likelihood for a measured qubit to remain in its measured eigenstate. It is important that a measurement is QND when a qubit must be repeatedly measured, for instance in measurement-based quantum error correction schemes. In practice, a measurement can be non-QND by kicking the qubit out of its two-level subspace. In general, these effects can become pronounced in readout schemes which require high amplitude readout pulses or have too much backaction.

Figure 8:
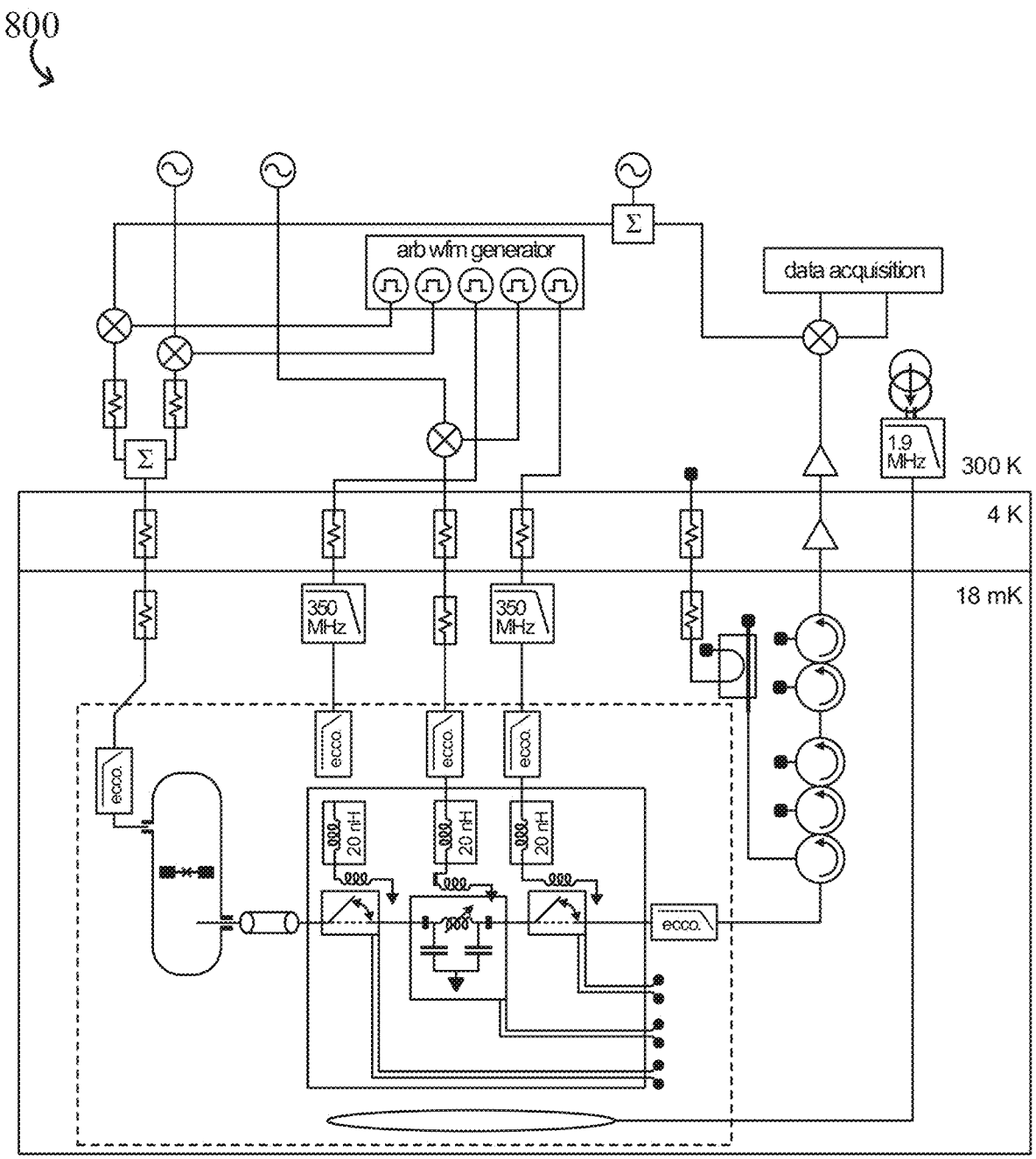
FIG. 8 illustrates an experimental schematic in an implementation.

In operation, the qubit, readout cavity and SIMBA are placed inside of a cryoperm can at the base temperature stage of a dilution refrigerator. A complete experimental schematic 800 for qubit readout using a SIMBA is shown in FIG. 8. Eccosorb filters are placed on the lines running in and out of the qubit+readout cavity+SIMBA system, in order to shield the qubit from high-frequency radiation.

Note that the SIMBA may be placed as close as possible to the readout cavity in order to minimize the electrical length between them. If any mode formed by this electrical length falls close in frequency to the readout/parametric cavity frequency, a significant fraction of the readout pulse can also couple into it. This lowers the measurement efficiency and can complicate the calibration procedure. In this work, the strongly coupled port of the readout cavity is constructed using an SMA connector, which is then screwed directly into another SMA connector on the SIMBA sample box. This results in approximately 3 cm of waveguide between the readout cavity and SIMBA chip. This length may be significantly shortened in future designs by engineering a more compact connection mechanism.

In conclusion, a SIMBA demonstrates superconducting qubit readout with state-of-the-art measurement efficiency and low excess backaction. The combination of these features is achieved without any ferrite circulator or isolator placed between the qubit and parametric amplifier. Readout is also fast, high fidelity and largely quantum non-demolition. As such, the SIMBA is a promising platform for scalable superconducting qubit measurement.

Figure 9:
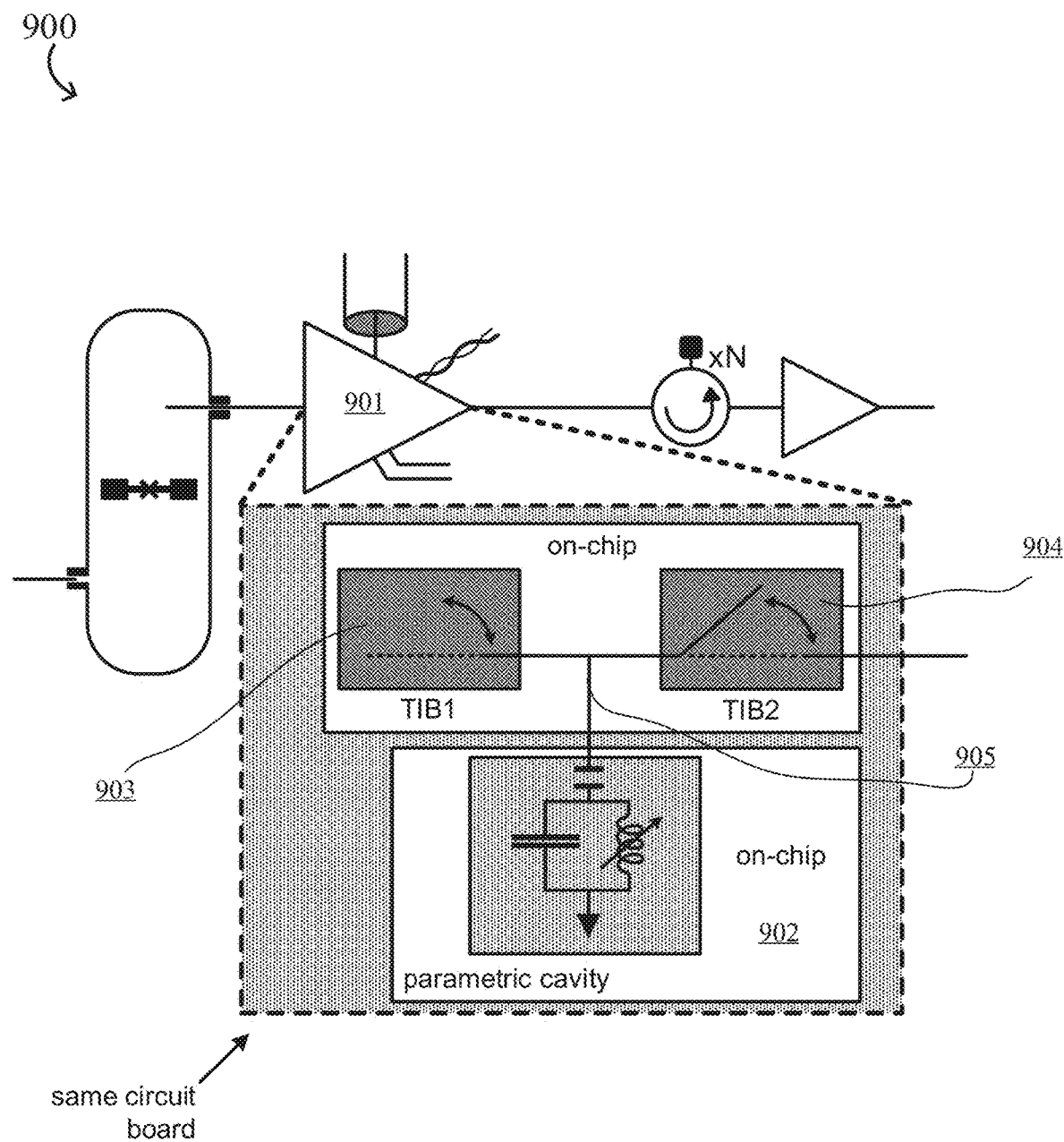
FIG. 9 illustrates an alternative device design in an implementation.

An alternative design different than discussed elsewhere in this work is discussed and illustrated in FIG. 9. This arrangement 900 is the same as in FIG. 1, except that it uses a SIMBA 901 constructed from a one-port JPA 902 connected to two TIBs (903, 904) via a microwave T-junction. The JPA and TIBs are on separate chips, connected together on the same printed circuit board. The measurement efficiency and readout fidelity of qubit readout demonstrated in this setup compare unfavorably to the readout demonstrated in the main text. Additionally, the calibration of this device was complicated both by the significant presence of trapped flux vorticies near the Josephson parametric amplifier, and by the microwave T-junction between the TIBs and JPA. However, the excess backaction of qubit readout was significantly lower than reported in the main text, with $n_b$=0.018 to 0.002 effective photons of excess backaction compared to $n_r^{proj}$~4 effective photons in a projective readout pulse. Thus, it may indeed be possible to reach a limit of negligible excess backaction $n_b \ll 1$ using a SIMBA.

Readout using a SIMBA can be improved to be significantly faster than the 265 ns measurement time reported in this work without detriment to the readout performance. Dispersive readout using a SIMBA is different from standard dispersive readout schemes because the external coupling rate is now tunable. Advantageously, the readout cavity external coupling can be made large during the measurement allowing for a fast readout but is otherwise tuned close to zero so that the qubit T1 time is not limited, obviating the need for a Purcell filter. For optimal readout using a SIMBA, it is desirable to minimize loss in the readout cavity and then, to turn on a large external coupling $g_0$ to the parametric cavity in order to quickly and efficiently swap the readout signal.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

In some implementations, the tunable coupling(s) disclosed herein comprise(s) a first superconducting switch and/or a second superconducting switch and the parametric amplifier comprises a parametric cavity having one or more ports. The first superconducting switch may be coupled to the parametric cavity via a first port and the second superconducting switch is coupled to the parametric cavity via a second port. Alternatively, both the first superconducting switch and the second superconducting switch may be coupled to the parametric cavity via the same port.

The components of an exemplary superconducting amplifier device may be integrated onto one or more chips or integrated circuits. For example, a single integrated circuit could include the parametric cavity, the first superconducting switch, and the second superconducting switch. In other implementations, the parametric cavity may be integrated on one chip, while the switches may be integrated on one or more other chips.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above may be combined in various ways to form multiple embodiments. As a result, the invention is not limited to the specific embodiments described above, but only by the claims and their equivalents.

What is claimed is:

1. A method for measuring one or more qubits, the method comprising:
    sending a signal into a readout cavity to probe a qubit that resides in the readout cavity, resulting in an entangled signal from which to derive a measurement of the qubit;
    swapping the entangled signal between the readout cavity and an amplifier device using a tunable coupling between the readout cavity and the amplifier device by connecting a superconducting switch for a duration of time to allow a parametric amplifier in the amplifier device to receive the entangled signal;
    amplifying the entangled signal to produce an amplified signal; and
    reading out the amplified to a measurement sub-system.

2. The method of claim 1 wherein:
    the parametric amplifier comprises a parametric cavity; and
    amplifying the entangled signal to produce the amplified signal comprises first disconnecting the superconducting switch and then pumping the parametric cavity to a bistable regime.

3. The method of claim 2 wherein reading out the amplified signal to the measurement sub-system includes reading out the amplified signal via one other superconducting switch coupling the parametric amplifier to the measurement sub-system.

4. The method of claim 2 wherein disconnecting the superconducting switch occurs once the duration of time has elapsed.

5. The method of claim 2 further comprising coupling the superconducting switch to the parametric cavity via a first port on the parametric cavity.

6. The method of claim 5 further comprising coupling the one other superconducting switch to the parametric cavity via a second port on the parametric cavity.

7. The method of claim 5 further comprising coupling the one other superconducting switch to the parametric cavity via the first port on the parametric cavity.

8. The method of claim 1 wherein the qubit comprises a transmon qubit.

9. The method of claim 1 wherein sending the signal into the readout cavity to probe the qubit resulting in the entangled signal comprises sending the signal into the readout cavity to probe the qubit that resides in the readout cavity, resulting in a qubit-state-dependent phase shift to create the entangled signal.

10. A superconducting amplifier device comprising:
    a parametric amplifier comprising a parametric cavity having one or more ports; and
    a tunable coupling between the parametric amplifier and a readout cavity external to the superconducting amplifier device and comprising a first superconducting switch and a second superconducting switch;
    wherein the tunable coupling allows an entangled signal, associated with a qubit in the readout cavity, to transfer from the readout cavity to the parametric amplifier; and
    wherein the parametric amplifier amplifies the entangled signal to produce an amplified signal as output to a measurement sub-system.

11. The superconducting amplifier device of claim 10 wherein the first superconducting switch is coupled to the parametric cavity via a first port and the second superconducting switch is coupled to the parametric cavity via a second port.

12. The superconducting amplifier device of claim 10 wherein both the first superconducting switch and the second superconducting switch are coupled to the parametric cavity via the same port.

13. The superconducting amplifier device of claim 10 further comprising a single chip, wherein the single chip has the parametric cavity, the first superconducting switch, and the second superconducting switch integrated thereon.

14. The superconducting amplifier device of claim 10 further comprising two or more chips on a single printed circuit board, wherein a one of the two or more chips has the parametric cavity integrated thereon, but neither the first superconducting switch nor the second superconducting switch is integrated thereon.

15. The superconducting amplifier device of claim 14 wherein another one of the two or more chips has the first superconducting switch integrated thereon, but neither the second superconducting switch nor the parametric cavity is integrated thereon.

16. The superconducting amplifier device of claim 10 wherein the qubit comprises a transmon qubit.

17. A quantum computing device comprising:
    a readout cavity, in which a qubit to be measured is located, configured to output an entangled signal produced by a probe of the qubit; and
    a superconducting amplifier device coupled with the readout cavity and configured to swap-in the entangled signal using a tunable coupling, amplify the entangled signal to produce an amplified signal, and read-out the amplified signal to a measurement sub-system wherein the superconducting amplifier device comprises a parametric amplifier that amplifies the entangled signal and comprises a superconducting switch that provides the tunable coupling between the parametric amplifier and the readout cavity.

18. The quantum computing device of claim 17 wherein the tunable coupling comprises a resonant coupling between a frequency of the readout cavity and a frequency of the parametric amplifier.

19. The quantum computing device of claim 17 wherein the parametric amplifier comprises a parametric cavity.

20. The quantum computing device of claim 17 wherein the qubit comprises a transmon qubit.

\* \* \* \* \*